(12) United States Patent
Yung et al.

(10) Patent No.: US 11,009,901 B2
(45) Date of Patent: May 18, 2021

(54) METHODS AND APPARATUS FOR VOLTAGE REGULATION USING OUTPUT SENSE CURRENT

(71) Applicant: QUALCOMM Incorporated, San Diego, CA (US)

(72) Inventors: Chi Fan Yung, Singapore (SG); Hua Guan, San Diego, CA (US); Ngai Yeung Ho, San Diego, CA (US); Kan Li, Singapore (SG)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/813,629

(22) Filed: Nov. 15, 2017

(65) Prior Publication Data
US 2019/0146531 A1   May 16, 2019

(51) Int. Cl.
| | | |
|---|---|---|
| G05F 1/563 | (2006.01) | |
| G05F 1/575 | (2006.01) | |
| G05F 3/24 | (2006.01) | |
| G11C 7/06 | (2006.01) | |
| G11C 7/10 | (2006.01) | |
| G11C 11/4074 | (2006.01) | |
| G11C 5/14 | (2006.01) | |

(52) U.S. Cl.
CPC .............. *G05F 1/575* (2013.01); *G05F 1/563* (2013.01); *G05F 3/247* (2013.01); *G11C 7/067* (2013.01); *G11C 7/1057* (2013.01); *G11C 11/4074* (2013.01); *G11C 5/147* (2013.01)

(58) Field of Classification Search
CPC .......... G05F 1/563; G05F 1/575; G05F 3/247; G11C 5/147; G11C 7/067; G11C 7/1057; G11C 11/4074
See application file for complete search history.

(56) References Cited

U.S. PATENT DOCUMENTS

| | | | | |
|---|---|---|---|---|
| 6,750,638 | B1 * | 6/2004 | Gang ...................... | G05F 1/575 323/280 |
| 6,856,124 | B2 * | 2/2005 | Dearn ..................... | G05F 1/575 323/273 |
| 7,002,409 | B1 * | 2/2006 | Aram ........................ | H03F 1/08 330/103 |
| 8,278,903 | B1 * | 10/2012 | Guo ..................... | H02M 3/1588 323/288 |
| 8,872,492 | B2 * | 10/2014 | Zhang ..................... | G05F 1/575 323/280 |
| 9,588,541 | B1 | 3/2017 | Ho et al. | |

(Continued)

OTHER PUBLICATIONS

Co-pending U.S. Appl. No. 15/296,608, filed Oct. 18, 2016.
(Continued)

*Primary Examiner* — Alex Torres-Rivera
*Assistant Examiner* — David A. Singh

(57) ABSTRACT

Certain aspects of the present disclosure generally relate a regulator. For example, the regulator may include a control stage, a sense capacitor having first and second terminals, the first terminal coupled to an output of the voltage regulator, and a current amplifier having an input coupled to the second terminal of the sense capacitor and an output coupled to the control stage. The control stage of the regulator may adjust the output voltage of the regulator based at least in part on a current generated by the current amplifier.

20 Claims, 12 Drawing Sheets

(56) References Cited

U.S. PATENT DOCUMENTS

| | | | | |
|---|---|---|---|---|
| 10,175,706 B2* | 1/2019 | Golara | ................... | G05F 1/575 |
| 2003/0111986 A1* | 6/2003 | Xi | ........................ | G05F 1/575 |
| | | | | 323/280 |
| 2003/0214275 A1* | 11/2003 | Biagi | .................... | G05F 1/575 |
| | | | | 323/280 |
| 2004/0164789 A1* | 8/2004 | Leung | ................... | G05F 1/575 |
| | | | | 327/546 |
| 2005/0189930 A1* | 9/2005 | Wu | ....................... | G05F 1/575 |
| | | | | 323/280 |
| 2007/0241727 A1* | 10/2007 | Luo | ................... | H02M 3/1588 |
| | | | | 323/272 |
| 2009/0001953 A1* | 1/2009 | Huang | ................. | G05F 1/575 |
| | | | | 323/281 |
| 2010/0164451 A1* | 7/2010 | Cerchi | ................. | G05F 1/565 |
| | | | | 323/282 |
| 2014/0266093 A1* | 9/2014 | Isham | ................ | H02M 3/158 |
| | | | | 323/271 |
| 2017/0108883 A1* | 4/2017 | Hu | ......................... | G05F 1/575 |
| 2018/0048276 A1* | 2/2018 | Khlat | ................... | H03G 3/3036 |
| 2018/0120876 A1* | 5/2018 | Petenyi | ................. | G05F 1/575 |
| 2019/0267999 A1* | 8/2019 | Nakai | .............. | H03K 19/0175 |

OTHER PUBLICATIONS

Milliken R.J., et al., "Full On-Chip CMOS Low-Dropout Voltage Regulator", IEEE Transactions on Circuits and Systems I: Regular Papers, vol. 54, No. 9, Sep. 2007, pp. 1879-1890.

* cited by examiner

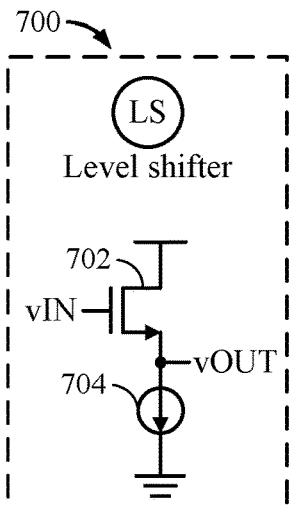
FIG. 7
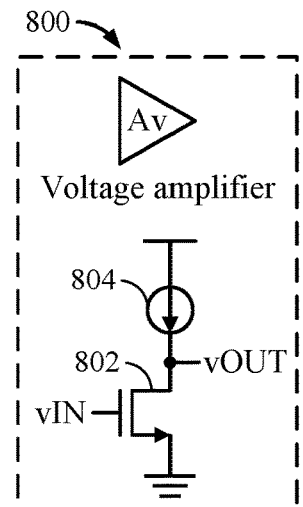
FIG. 8
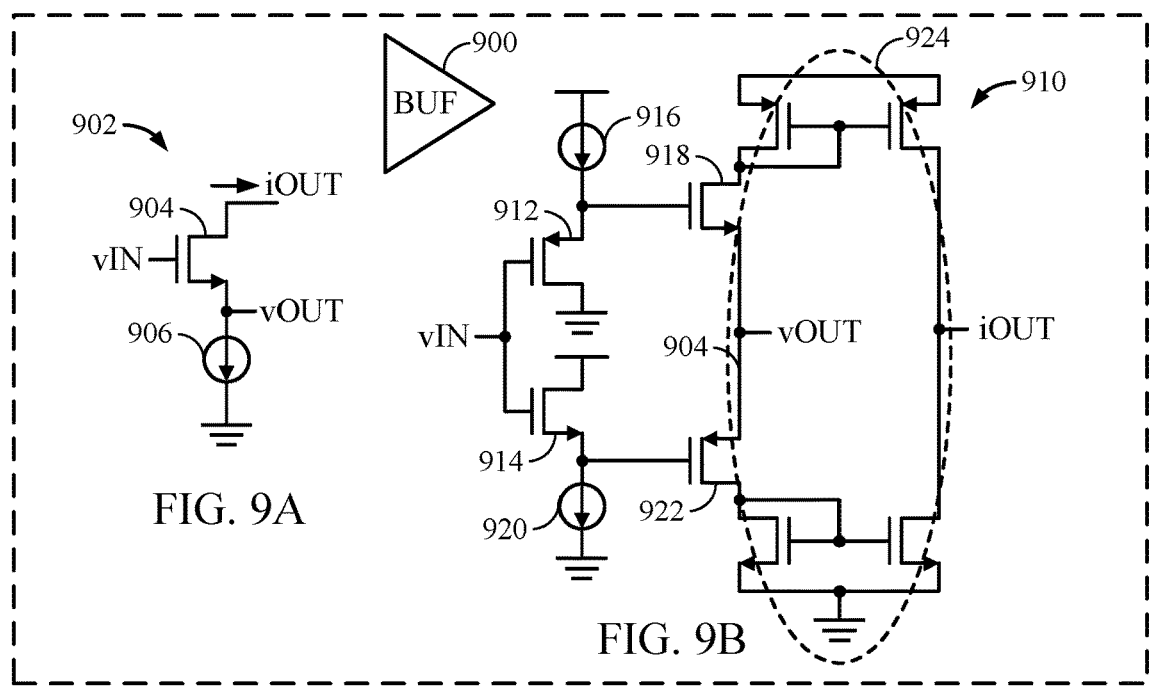
FIG. 9A
FIG. 9B
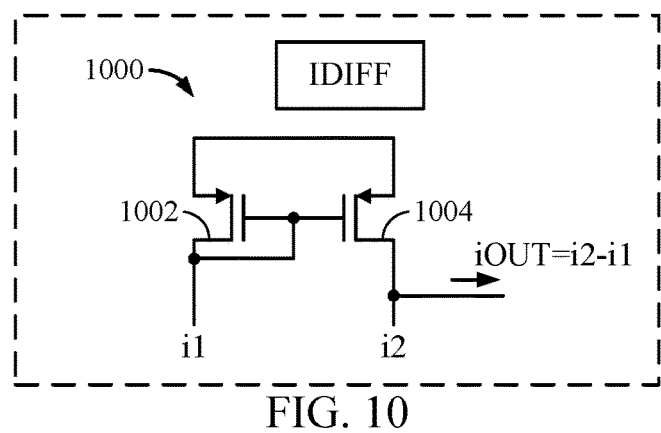
FIG. 10

METHODS AND APPARATUS FOR VOLTAGE REGULATION USING OUTPUT SENSE CURRENT

TECHNICAL FIELD

Certain aspects of the present disclosure generally relate to electronic circuits and, more particularly, to a circuit for a regulator.

BACKGROUND

Power management integrated circuits (power management ICs or PMICs) are used for managing the power requirement of a host system. A PMIC may be used in battery-operated devices, such as mobile phones, tablets, laptops, wearables, etc., to control the flow and direction of electrical power in the devices. The PMIC may perform a variety of functions for the device such as DC to DC conversion, battery charging, power-source selection, voltage scaling, power sequencing, etc. For example, a PMIC may be used for voltage regulation and may include a low-dropout (LDO) regulator.

When a regulator experiences a load attack, the output voltage of the regulator may dip below a target voltage value due to an increased current drawn by the load. Accordingly, it would be beneficial to enhance the transient response of the regulator to compensate for such a voltage dip to maintain regulation.

SUMMARY

Certain aspects of the present disclosure generally relate to a regulator using output sense current.

Certain aspects of the present disclosure provide a regulator. The regulator generally includes a control stage, a sense capacitor having first and second terminals, the first terminal coupled to an output of the voltage regulator, and a current amplifier having an input coupled to the second terminal of the sense capacitor and an output coupled to the control stage.

Certain aspects of the present disclosure provide a method for regulating a voltage. The method generally includes generating a sense current based on a current provided by an output capacitor to a load via a sense capacitor, the output capacitor and the sense capacitor being coupled to an output of a voltage regulator, amplifying the generated sense current via a current amplifier, and adjusting an output voltage of the voltage regulator based at least in part on the amplified sense current.

Certain aspects of the present disclosure provide a voltage regulator. The voltage regulator generally includes means for generating a sense current based on a current provided by an output capacitor to a load, the output capacitor and the means for generating being coupled to an output of the voltage regulator, means for amplifying the generated sense current, and means for adjusting an output voltage of the voltage regulator based at least in part on the amplified current.

Certain aspects of the present disclosure provide a voltage regulator. The voltage regulator generally includes a control loop configured to adjust an output voltage provided the voltage regulator, a sense capacitor coupled to an output of the voltage regulator, the sense capacitor configured to provide a current proportional to a current provided by an output capacitor to a load, and a current amplifier configured to amplify the sense capacitor current and provide the amplified sense current to the control loop.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 illustrates an example implementation of the level shifting stage of the current amplifier of FIG. 6, in accordance with certain aspects of the present disclosure.

FIG. 8 illustrates an example implementation of the voltage amplification stage of the current amplifier of FIG. 6, in accordance with certain aspects of the present disclosure.

FIGS. 9a and 9b illustrate example implementations of the buffer stage of the current amplifier of FIG. 6, in accordance with certain aspects of the present disclosure.

FIG. 10 illustrates an example implementation of the current differencer of the current amplifier of FIG. 6, in accordance with certain aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Wireless System

Figure 1:
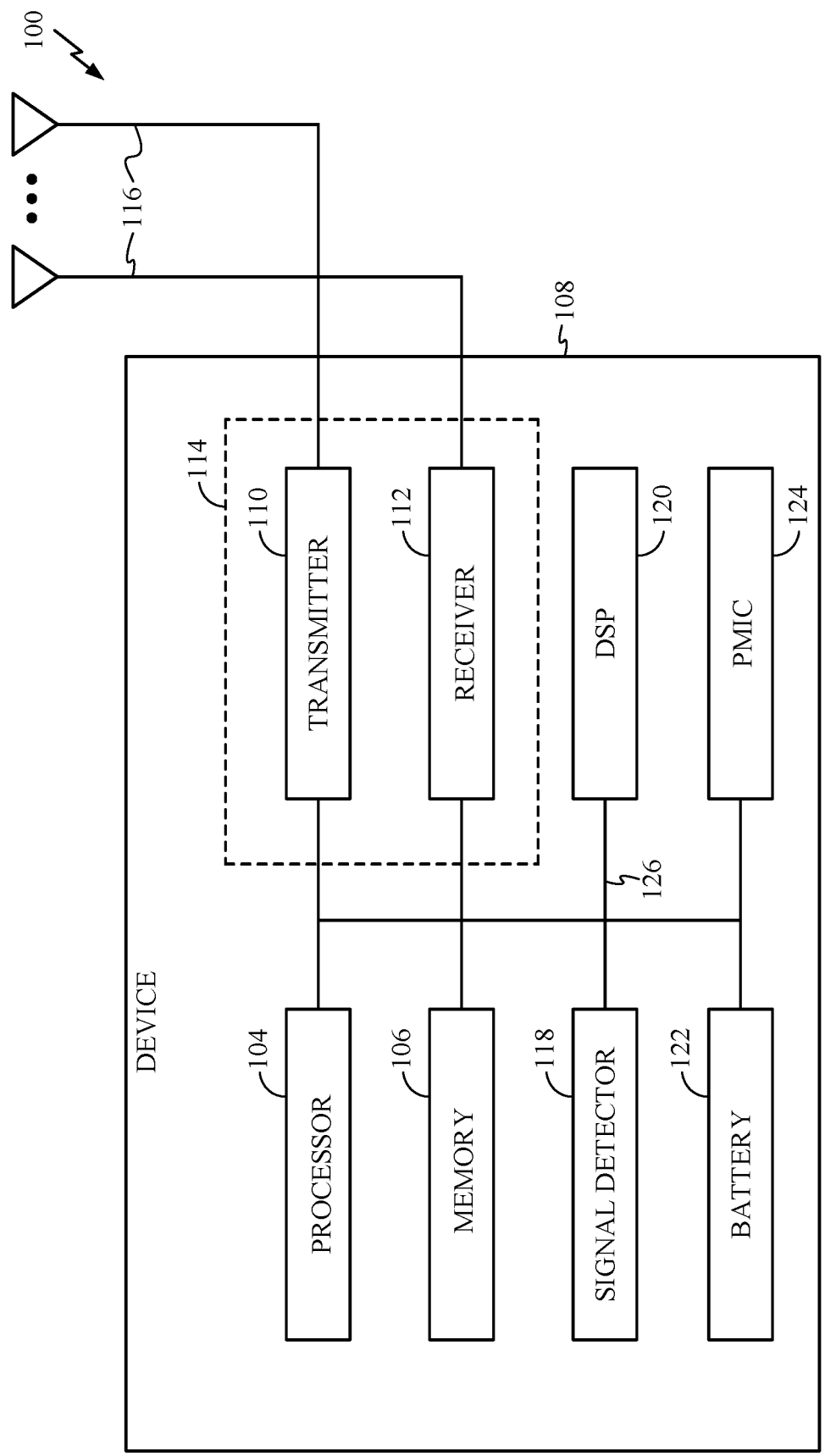
FIG. 1 illustrates a block diagram of an example device including a voltage regulator, according to certain aspects of the present disclosure.

FIG. 1 illustrates a device 100. The device 100 may be a battery-operated device such as a cellular phone, a personal digital assistant (PDA), a handheld device, a wireless modem, a laptop computer, a tablet, a personal computer, etc. The device 100 is an example of a device that may be configured to implement the various systems and methods described herein.

The device 100 may include a processor 104 which controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The device 100 may also include a housing 108 that may include a transmitter 110 and a receiver 112 to allow transmission and reception of data between the device 100 and a remote location. The transmitter 110 and receiver 112 may be combined into a transceiver 114. A plurality of transmit antennas 116 may be attached to the housing 108 and electrically coupled to the transceiver 114. The device 100 may also include (not shown) multiple transmitters, multiple receivers, and multiple transceivers.

The device 100 may also include a signal detector 118 that may be used in an effort to detect and quantify the level of signals received by the transceiver 114. The signal detector 118 may detect such signals as total energy, energy per subcarrier per symbol, power spectral density and other signals. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC to DC conversion, battery charging, power-source selection, voltage scaling, power sequencing, etc. In certain aspects, the PMIC 124 includes a voltage regulator (e.g., low-dropout regulator (LDO)) as described herein, and may be used for voltage regulation.

The various components of the device 100 may be coupled together by a bus system 126, which may include a power bus, a control signal bus, and a status signal bus in addition to a data bus.

Example Regulator Using Output Sense Current

Certain aspects of this present disclosure generally relate to a voltage regulator (e.g., LDO) using an output sense current. Using an output sense current, as described herein, may provide several advantages, including improving the transient response of the regulator. That is, for the same output capacitor size, a faster transient response may be obtained as compared to a regulator with only a single feedback loop. Faster transient response may lead to a smaller undershoot and/or overshoot of the output voltage of the regulator in response to a load attack (e.g., increased load current). Therefore, by improving the transient response with an output sense current implementation, the size of the output capacitor may be reduced compared to a regulator not configured to sense output current, thereby reducing bill of material (BOM) costs. Moreover, improving the transient response increases the recovery speed of the output voltage in response to a load attack, which is an especially desirable feature for regulators driving a digital load. A tighter regulator output voltage may translate to improved overall system efficiency.

Voltage regulators, such as a LDO regulator, may include a power transistor and a differential amplifier. In some implementations, a p-channel metal-oxide semiconductor (PMOS) transistor may be used instead of an n-channel metal-oxide semiconductor (NMOS) transistor. For example, the PMOS transistor uses a lower gate drive voltage than an NMOS transistor. However, the PMOS transistor may have a lower carrier mobility than an NMOS transistor, and therefore a larger area may be dedicated for the PMOS transistor. Accordingly, in certain aspects, it may be beneficial to use a NMOS transistor instead of a PMOS transistor in a voltage regulator to reduce the size of the voltage regulator. However, as discussed above, an NMOS transistor may use a higher gate drive voltage than a PMOS transistor.

Figure 2:
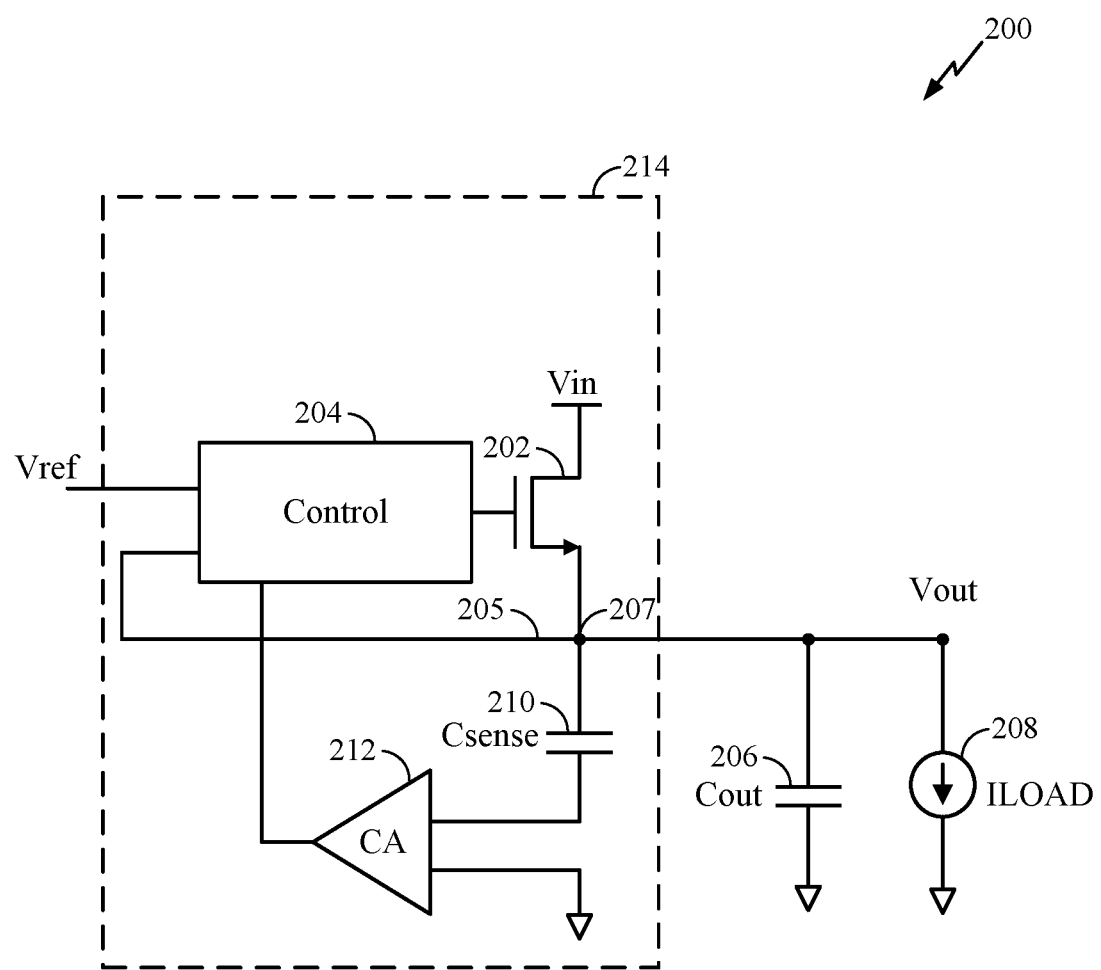
FIG. 2 illustrates an example implementation of a regulator using output sense current, in accordance with certain aspects of the present disclosure.

FIG. 2 illustrates an example regulator 200 using an output sense current, in accordance with certain aspects of the present disclosure. As illustrated, the regulator 200 is implemented using an NMOS transistor (e.g., passFET) 202 having a drain coupled to an input voltage Vin and a source coupled to the output node 207 to generate the output voltage Vout. In another implementation, the transistor may be implemented as a PMOS transistor. A control stage 204 is used to control the gate of transistor 202 by comparing a reference voltage Vref input with an output voltage Vout input to regulate a desired output voltage Vout of the regulator 200. During load attack conditions where a load draws a load current 208 from the output of the regulator 200, the output voltage of the regulator 200 may drop in response to the current draw. The control stage 204 detects the drop in the output voltage by comparing the monitored output voltage, via a feedback loop 205 coupled between the output of the regulator and an input of the control stage 204, with the reference voltage to adjust the gate bias of transistor 202 to compensate for the voltage drop. The control stage in combination with the feedback loop may be referred to as a control loop. The voltage drop will also cause an output capacitor 206 coupled to the output of the regulator 200 to discharge an amount of current to the load. Accordingly, the output capacitor current discharged from the output capacitor 206 is indicative of a load attack. By sensing the output capacitor current, the regulator may be made aware of the load attack. Furthermore, as the output current at the regulator output leads the output voltage by a 90-degree phase, the control stage 204 may be aware of the load attack earlier when sensing the output current of the output capacitor 206, as compared to sensing the output voltage drop, thereby allowing for an improved transient response of output voltage regulation by the regulator 200.

To sense the current of the output capacitor 206, the regulator further includes a sense capacitor 210 having a first terminal coupled to the output of the regulator 200 and a second terminal coupled to a current amplifier (CA) 212. As the sense capacitor 210 and the output capacitor are both coupled to the output of the regulator, the voltage drop at the output will cause the sense capacitor 210 to discharge an amount of current to the load. The amount of current discharged by the sense capacitor 210 will be proportional to the amount of current discharged by output capacitor 206 based on the relative capacitance of each as given by Equation 1.

$$Isense = \frac{C_{sns}}{C_{out}} * Ic \qquad \text{Eq. (1)}$$

Where: Isense=sense current
$C_{sns}$=capacitance of the sense capacitor
$C_{out}$=capacitance of the output capacitor; and
Ic=change in the load current By sensing the current discharged by the sense capacitor 210, the amount of current discharged by the output capacitor 206 can be estimated. In one implementation, current amplifier 212 is configured to sense the current discharged by the sense capacitor 210 and provide (i.e., inject) an amplified current to at least a portion of the control stage 204 via an output of the current amplifier 212. The amount of amplification provided by the current amplifier 212 may consist of a unitary gain factor (i.e., 1) or any amount more than or less than a unitary gain factor. For example, the current amplifier may amplify the sense current by a factor of ten (10×). The control stage 204 receives the amplified current and uses the amplified current to control the gate bias of transistor 202 to improve the transient response of the regulator 200 as will be discussed herein.

In one implementation, the regulator 200 components contained in the box 214 (e.g., sense capacitor 210) are located on the same semiconductor die while components located output of the box 214 (e.g., output capacitor 206) are located off the semiconductor die, such as on a different semiconductor die or discrete component. In another implementation, the output capacitor 206 may be located on the same semiconductor as the components located inside box 214.

Figure 3:
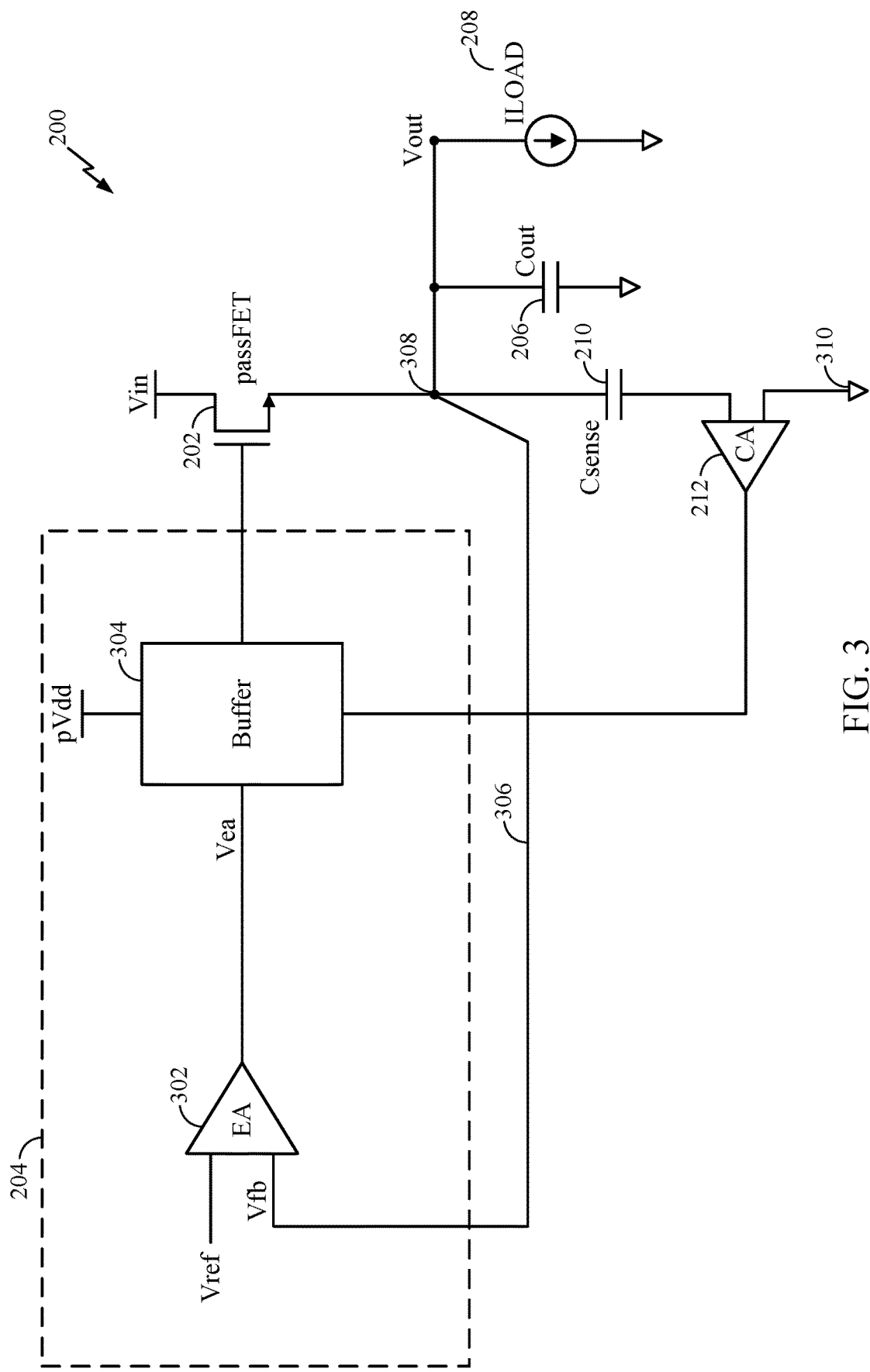
FIG. 3 illustrates an example implementation of the control stage of FIG. 2 using an error amplifier (EA) and buffer, in accordance with certain aspects of the present disclosure.

FIG. 3 illustrates an example implementation of the control stage 204 of FIG. 2 using an error amplifier (EA) 302 and a buffer 304. The buffer 304 may be used to buffer an output signal of the amplifier 302 to drive a gate of the transistor 202 (e.g., passFET). The buffer 304 may be powered by a positive voltage rail pVdd. The error amplifier 302 adjusts the output voltage Vout based on a reference voltage Vref. For example, the amplifier 302 generates a reference voltage Vea that is input to the buffer 304 by comparing the reference voltage Vref and a feedback voltage Vfb received from a feedback path 306. For example, the amplifier 302 may adjust the reference voltage Vea at the input of the buffer 304 in an attempt to force its inputs (e.g., signals Vref and Vfb) to be the same. In certain aspects, a gain stage (β) may be implemented in the feedback path 306 (not shown).

Aspects of the present disclosure implement an output sense current for regulating a voltage. For example, a current from a sense capacitor 210, that is proportional to an output current being provided by an output capacitor 206, is sensed and amplified by a current amplifier 212. In one implementation, the current amplifier 212 includes differential inputs with a first input coupled to a terminal of the sense capacitor 210 and a second input coupled to ground 310 (i.e., reference potential). As the sense capacitor 210 is to provide a proportional representation of the current supplied by the output capacitor 206 to the load which is coupled between the output node 308 and ground, the sense capacitor having a first terminal coupled between the output node and ground. However, to sense the discharge current of the sense capacitor, the current amplifier is coupled between the sense capacitor 210 and ground. Accordingly, the current amplifier is configured to have a low input impedance to appear as an alternating current (AC) ground to the terminal of the sense capacitor 210 connected to the current amplifier 212. The sensed current is amplified by the current amplifier 212 and provided to at least a portion of the control stage 204 comprising the buffer 304. By providing the amplified current to the buffer 304, the buffer 304 can respond to current fluctuations at the output node 308. That is, without the amplified current, current fluctuations at the output node 308 would not be relayed to the control stage 204 and instead the control stage 204 would response to the voltage fluctuations at the output node 308. Therefore, with the amplified sense current being provided to the buffer 304, the regulator 200 can more quickly respond to voltage fluctuations by utilizing sensed current fluctuations at the output node 308, improving the transient response of the regulator 200.

Figure 4:
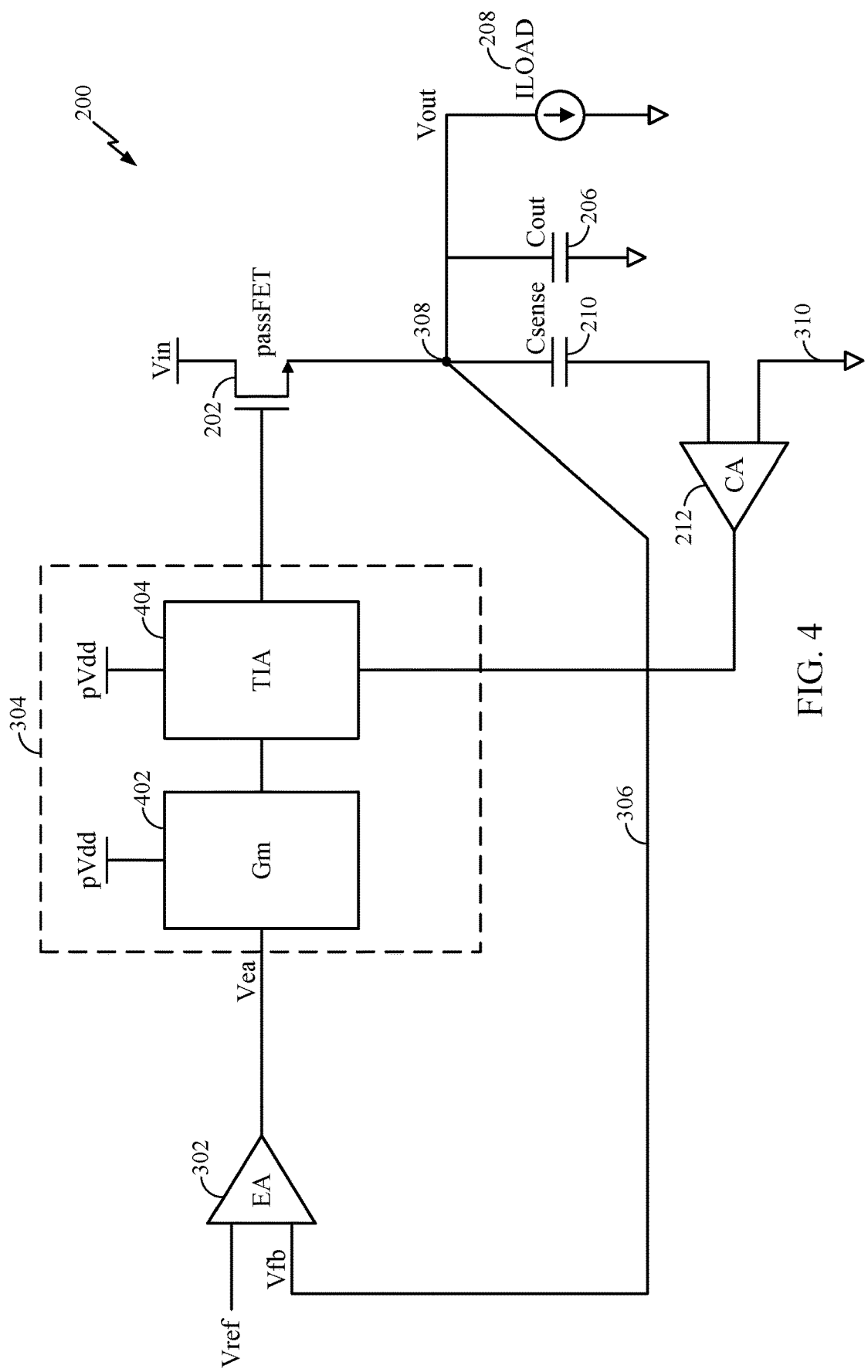
FIG. 4 illustrates an example implementation of the buffer of FIG. 3 using a transconductance (Gm) stage and a transimpedance amplifier (TIA), in accordance with certain aspects of the present disclosure.

FIG. 4 illustrates an example implementation of the buffer 304 of the regulator 200, in accordance with certain aspects of the present disclosure. The buffer 304 may include a transconductance (Gm) stage 402 and a transimpedance amplifier (TIA) 404. In certain aspects, the Gm stage 402 may generate a current based on the reference voltage Vea and provide the generated current to TIA 404. For example, as the reference voltage Vea increases, the current generated by the Gm stage 402 increases. The TIA 404 may use the current generated by the Gm stage 402, and drive the transistor 202 via a control voltage generated at the gate of the transistor 202. The TIA 404 may further receive the amplified sense current from the current amplifier 212. By receiving the amplified sense current, that is indicative of a current draw from a load attack, the TIA may adjust the control voltage of transistor 202 using the amplified sense current to adjust the voltage at the gate of transistor 202. Since the current fluctuations at the output node 308 lead the voltage fluctuations by a 90-degree phase, the TIA may begin to adjust the control voltage of transistor 202 prior to voltage fluctuations of the load attack appearing in reference voltage Vea, thereby improving the transient response of the regulator 200. As the transient response of the regulator 200 is improved, the regulator 200 may have an output capacitor with a smaller capacitance to achieve a similar transient response as compared to a regulator not configured to sense output current. By reducing the capacitance of the output capacitor, the capacitor may be smaller to save on die area and cost.

Figure 5:
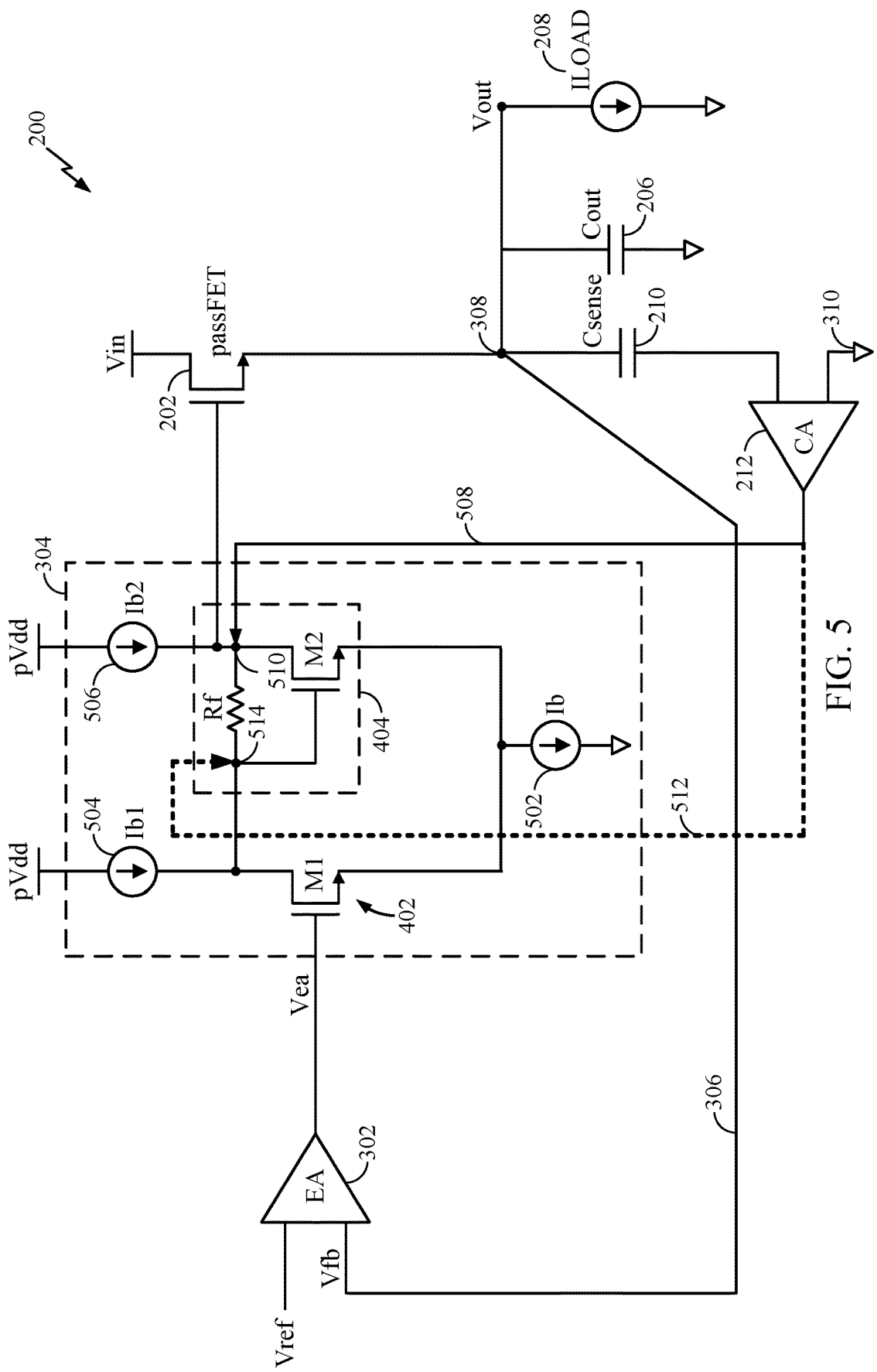
FIG. 5 illustrates an example implementation of the Gm stage and the TIA stage of FIG. 4, in accordance with certain aspects of the present disclosure.

FIG. 5 illustrates an example implementation of the Gm stage 402 and the TIA 404 of the regulator 200, in accordance with certain aspects of the present disclosure. For example, the Gm stage 402 may be implemented using a transistor M1. In certain aspects, a gate of the transistor M1 may be coupled to the output of amplifier 302 and a source of the transistor M1 may be coupled to a bias current source 502 configured to generate a bias current Ib. Thus, the gate to source voltage (Vgs) of the transistor M1 may be equal to, and the drain current of the transistor M1 may be a function of the reference voltage Vea.

In certain aspects, a current source 504 may be coupled to the drain of the transistor M1 and generate a bias current Ib1. As illustrated, the current source 504 is coupled to the drain of transistor M1. A current, generated based on the difference between the drain current of transistor M1 and the bias current Ib1, is amplified by the TIA 404, which may be implemented using a transistor M2, a current source 506 configured to generate a bias current Ib2, and an impedance Rf (e.g., a resistance). For example, when there is a load attack (e.g., ILOAD increases), the output voltage Vout decreases (e.g., dips). As the EA 302 receives output voltage Vout via feedback path 306 and compares it with reference voltage Vref, the decrease in Vout will cause an increase in reference voltage Vea. The increase in reference voltage Vea at the gate of M1 will cause an increase in drain current of transistor M1. The TIA 404, which is implemented in FIG. 5 with the transistor M2 and impedance Rf, will see a reduced current, and thus lower voltage potential, at the gate of transistor M2 due to the increased drain current of transistor M1. The decrease in the voltage potential at the gate of M2 will decrease the drain current of M2 causing the voltage potential at the drain of M2 to increase which is used as a control voltage for transistor 202. By causing the control voltage to increase at the gate of the transistor 202, transistor 202 will supply an increased load current to the output node 308.

The TIA 404 may be further configured to receive amplified current provided by the current amplifier 212 from current provided by the sense capacitor 210 generated in response to a load attack. The TIA 404 may receive the amplified current at a node of transistor M2 to enhance the transient response of the regulator to the load attack. In one implementation, the current amplifier may provide (e.g., inject) the amplified current via path 508 to the drain of transistor M2 at node 510. At steady state, the bias currents Ib1 and Ib2 may be equal. However, when the current amplifier provides an amplified sense current due to a load attack, the bias current provided to the drain of transistor M2 increases (i.e., bias current Ib2 plus the amplified sense current), allowing the gate capacitance of the transistor 202 to be charged more quickly. Therefore, the capability of the TIA 404 via the addition of the injected amplified sense current, improves the transient response of the regulator 200.

In another implementation, the amplified current may be provided via path 512 to a node 514 between the impedance Rf and the gate of transistor M2. By providing and amplified sense current to the node 514, the TIA 404 may use the increase in input current caused by the injected amplified sense current to generate a corresponding increase in the control voltage being applied to the gate of transistor 202 to adjust the output voltage Vout. As the TIA 404 is directly being injected with current information of a load attack via the amplified sense current, instead of waiting for the voltage dip of the output voltage Vout to propagate through the error amplifier 302, GM stage 402, and TIA 404, the transient response of the regulator 200 may be improved.

Aspects of the present disclosure improve the transient response of the regulator 200. Thus, for the same output capacitor (Cout) size, a faster transient response may be obtained compared to a regulator not implementing output current sense, leading to smaller undershoot and/or overshoot of the output voltage of the regulator in response to a load attack (e.g., increased ILOAD).

Figure 6:
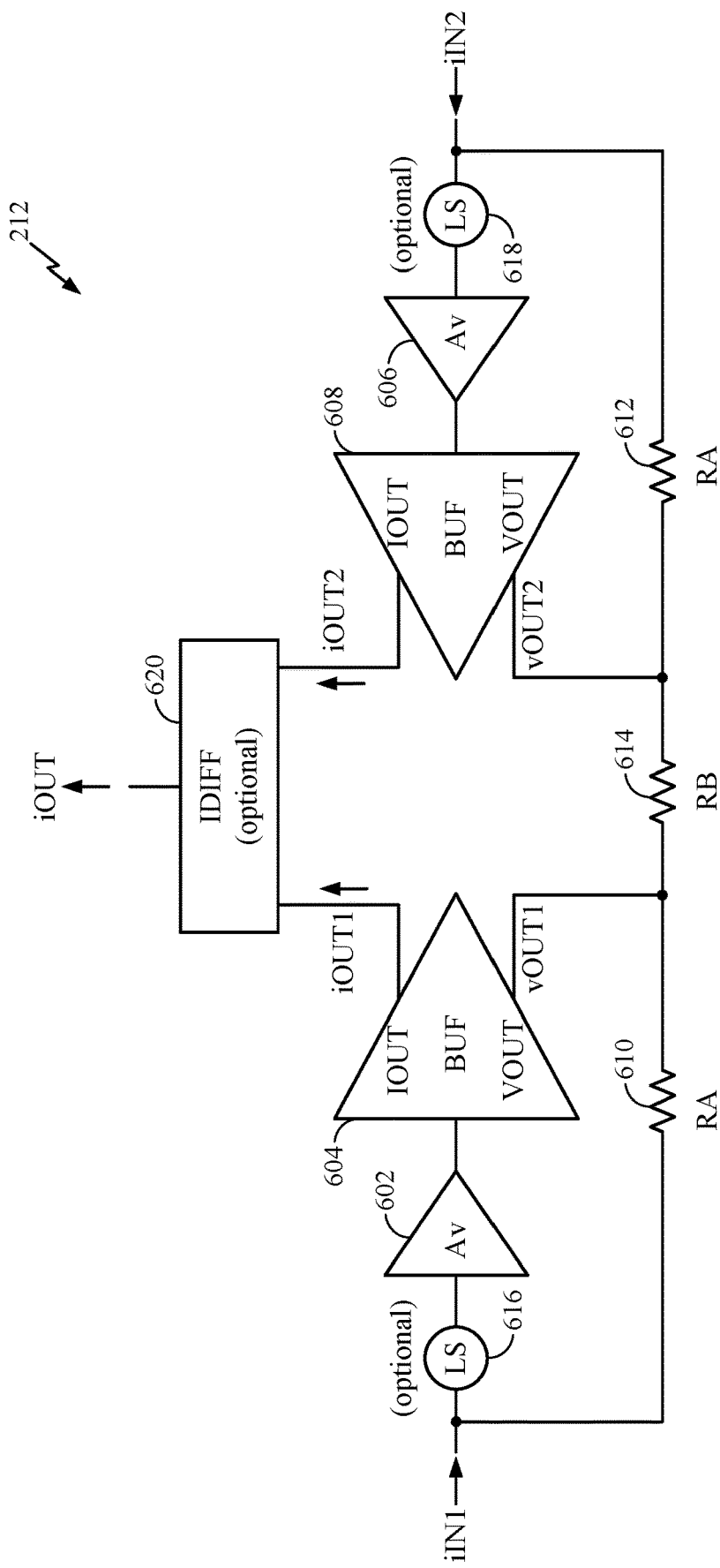
FIG. 6 illustrates an example implementation of the current amplifier of the regulator of FIG. 2, in accordance with certain aspects of the present disclosure.

FIG. 6 illustrates an example current amplifier 212 of the regulator 200, in accordance with certain aspects of the present disclosure. In one implementation, the current amplifier 212 may be configured as an operational amplifier with differential inputs iIN1 and iIN2 with a low input impedance. Differential input iIN1 may be coupled to an input of a first voltage amplification stage 602 and a terminal of sense capacitor 210. The output of the first voltage amplification stage 602 is coupled to the input of a first buffer stage 604. The first buffer stage 604 further includes a voltage output vOUT1 and a current output iOUT1. Similarly, differential input iIN2 is coupled to an input of a second voltage amplification stage 606 having an output coupled to an input of a second buffer stage 608. The differential input iIN2 may be further coupled to ground 310. The second buffer stage 608 further includes a voltage output vOUT2 and a current output iOUT2. The current outputs of the first and second buffer stages 604, 608 are coupled to the output of the current amplifier 212. Optionally, the current amplifier may include a current differencer 620 coupled to the current outputs of the first and second buffer stages 604,608, the current differencer 620 being configured to receive the current outputs iOUT1 and iOUT2 as differential inputs and output a single-ended output current signal iOUT representative of the amplified output sense current. An exemplary benefit of implementing a current differencer 620 is that a bias component introduced during the current amplification may be removed from the current outputs iOUT1 and iOUT2 which will be discussed in more detail herein.

The current amplifier 212 further includes a first resistive element (RA) 610 coupled between the voltage output vOUT1 of the first buffer stage 604 and the differential input iIN1, a second resistive element (RA) 612 coupled between the voltage output vOUT2 of the second buffer stage 608 and the differential input iIN2, and a third resistive element (RB) 614 having a first terminal coupled to voltage output vOUT1 and the first resistive element 610 and a second terminal coupled to voltage output vOUT2 and the second resistive element 612. In one implementation, the first resistive element 610 and the second resistive element 612 have substantially the same resistance value (i.e., a resistance value within a tolerance of a target resistance value). The first and second voltage amplification stages 602,606 may be configured to provide high gain and present a high input impedance. As the voltage amplification stages 602,606 have a high input impedance at the respective differential inputs iIN1 and iIN2, little current will flow through the voltage amplification stages 602,606 to the inputs of the buffer stages. Rather, most of the current from the differential inputs will flow through the first, second, and third resistive elements 610,612,614. For example, the current from differential input iIN1 will flow through the first resistive element 610 whereby a portion of the current is provided (e.g., half) to the voltage output vOUT1 of the first buffer stage 604 and the remaining portion of the current is provided to the third resistive element 614. Similarly, the current from differential input iIN2 will flow through the second resistive element 612 whereby a portion of the current is provided to the voltage output vOUT2 of the second buffer stage 608 and the remaining portion of the current is provided to the third resistive element 614. As the differential inputs iIN1 and iIN2 have a high input impedance with a high gain via the voltage amplification stages 602,606, any delta in voltage between the differential inputs should be small as the potential on the differential inputs should be maintained to be substantially the same as one another. The maintenance of the potentials of the differential inputs to be the substantially the same can be classified as a virtual short connecting the differential inputs together. This virtual short allows the current amplifier 212 to present a low input impedance and may be inversely proportional to the gain of the voltage amplification stages 602,606. Furthermore, the current flowing through the third resistive element 614 would be forced into the voltage output of the other buffer stage in order to maintain the potential at the differential inputs. For example, the portion of the current from differential input iIN1 flowing across the third resistive element 614 would be forced into vOUT2 of the second buffer stage 608 and vice-versa for the portion of current from differential input iIN2 across the third resistive element 614. Accordingly, the gain of the amplified current provided by the current amplifier 212 is set by the resistor ratios of the current split between the first and third resistive elements 610,614 and the second and third resistive elements 612, 614. One exemplary benefit of the gain set by resistor ratios is that it may be difficult to achieve accurate resistive values of the resistive elements depending on manufacturing process. However, the resistive mismatch between the resistive elements may be more accurately controlled. Accordingly, the accuracy of the gain achieved of the current amplifier may be insensitive to the accuracy of the actual resistive values of the resistive elements of a particular process as long as the mismatch between the resistive elements is substantially the same. In addition, the gain can be achieved without the use of current mirrors to achieve current amplification which may limit bandwidth and have increased quiescent currents due to the gain being a function of a current mirror ratio (1:M) where the necessary bias currents increase with a higher M.

The current amplifier 212 may optionally include a first level shifting stage 616 having an input coupled to differential input iIN1 and the first resistive element 610 and an output coupled to the input of the first voltage amplification stage 602 and a second level shifting stage 618 having an input coupled to differential input iIN2 and the second resistive element 612 and an output coupled to the input of the second voltage amplification stage 606. The first and second level shifting stages 616, 618 are configured to translate (i.e., shift) the input voltage seen at a respective differential input to another voltage domain, for example, to change a common mode voltage of the current amplifier 212.

By shifting the inputs to another voltage domain, the level shifting stages 616, 618 may improve the linearity, and therefore gain, of the first and second voltage amplification stages 602,606 in both a positive and negative direction.

It should be noted that while the current amplifier 212 implemented in FIG. 6, is differential, one or more stages of FIG. 6 may be omitted to implement a single-ended implementation the current amplifier 212.

FIG. 7 illustrates an example implementation of the level shifting stage of the current amplifier of FIG. 6, in accordance with certain aspects of the present disclosure. In one implementation, level shifting stage 616,618 comprises a level shifter 700. The level shifter includes a transistor 702 having a gate coupled to a voltage input, a drain coupled to a voltage rail, and a source coupled to a voltage output and a current source 704.

FIG. 8 illustrates an example implementation of the voltage amplification stage of the current amplifier of FIG. 6, in accordance with certain aspects of the present disclosure. In one implementation, the voltage amplification stage 602,606 comprises a voltage amplifier 800. The voltage amplifier 800 includes a transistor 802 having a gate coupled to a voltage input, a drain coupled to a current source 804 and a voltage output, and a source coupled to a reference potential. In this example, the reference potential is ground. The voltage amplifier is configured amplify a signal at the voltage input at output an amplified voltage at the voltage output.

FIGS. 9a and 9b illustrate example implementations of the buffer stage of the current amplifier of FIG. 6, in accordance with certain aspects of the present disclosure. In one implementation, the buffer stage comprises a current buffer 900. Referring now to FIG. 9a, an example implementation 902 of the current buffer 900 is shown. The current buffer 902 comprises a transistor 904 having a gate coupled to a voltage input, a drain coupled to a current output (i.e., iOUT1 or iOUT2), and a source coupled a voltage output (i.e., vOUT1 or vOUT2) and a current source 906. The current source 906 is configured to provide a bias current IBIAS. When the current buffer 902 is implemented as buffer stage 604,608 in current amplifier 212, the gain of the sense current provided by the current outputs iIOUT1 and iOUT2 may be expressed according to Equations 2 and 3.

$$iOUT1 = (1 + RA/RB)iIN1 - (RA/RB)iIN2 - IBIAS \quad \text{Eq. (2):}$$

$$iOUT2 = (1 + RA/RB)iIN2 - (RA/RB)iIN1 - IBIAS \quad \text{Eq. (3):}$$

Referring now to FIG. 9b, is another example implementation 910 of current buffer 900 is shown. The current buffer 910 comprises a first transistor 912 and a second transistor 914 having respective gates coupled together at a voltage input. The first transistor 912 further includes a source coupled a current source 916 and an output coupled to a gate of a third transistor 918 and a drain coupled to ground. The second transistor 914 further includes a drain coupled to a voltage rail and a source coupled to a current source 920 and a gate of a fourth transistor 922. The sources of the third and fourth transistors 918,922 are coupled together and to a voltage output (i.e., vOUT1 or vOUT2). The drains of the third and fourth transistors 918,922 are coupled to a current mirror circuit 924 comprising two current mirrors, the current mirror circuit 924 further including a current output (i.e., iOUT1 or iOUT2). In one implementation, the current buffer 910 may comprise a class AB push-pull buffer. When the current buffer 910 is implemented as the buffer stages 604,608 in the current amplifier 212, the gain of the sense current provided by the current outputs iIOUT1 and iOUT2 may be expressed according to Equations 4 and 5.

$$iOUT1=(1+RA/RB)iIN1+(RA/RB)iIN2 \quad \text{Eq. (4):}$$

$$iOUT2=(1+RA/RB)iIN2+(RA/RB)iIN1 \quad \text{Eq. (5):}$$

An exemplary benefit of the configuration of the current buffer as a class AB buffer is that the buffer may achieve a wide linear range of operation with low quiescent current.

FIG. 10 illustrates an example implementation of the current differencer of the current amplifier of FIG. 6, in accordance with certain aspects of the present disclosure. In one implementation 1000 of the current differencer 620, the current differencer 1000 includes a current mirror comprising a first transistor 1002 and a second transistor 1004. The first transistor 1002 includes a drain coupled to a first differential current input i1 (e.g., iOUT1) and to the gates of the first and second transistor 1002,1004 that are tied together. In addition, the sources of the first and second transistor 1002,1004 are coupled. The second transistor further includes a drain coupled to a second differential current input i2 (e.g., iIOUT2). The current differencer 1000 is configured to remove a bias component from the differential input currents. For example, in a current amplifier implementing current buffers in accordance with FIG. 9a, the output currents will contain a bias current IBIAS provided by their current source 906. The current differencer 1000 operates by mirroring one side a differential current and folds it to get subtraction from the other input current to output a single-ended output current iOUT. Equation 6 expresses the single-ended current when operating the current differencer 1000 with the current buffers 902 which removes the bias current component IBIAS contained in Eqs. 2 and 3.

$$iOUT1=(1+2RA/RB)(iIN2-iIN1) \quad (6):$$

It should be noted that while the implementations of FIGS. 7-10 have been shown as being implemented with certain transistor topologies and arrangements (e.g., PMOS, NMOS), other types of transistor topologies and arrangements may be used to implement the functionality of FIGS. 7-10 without departing from the scope of the present disclosure.

Figure 11:
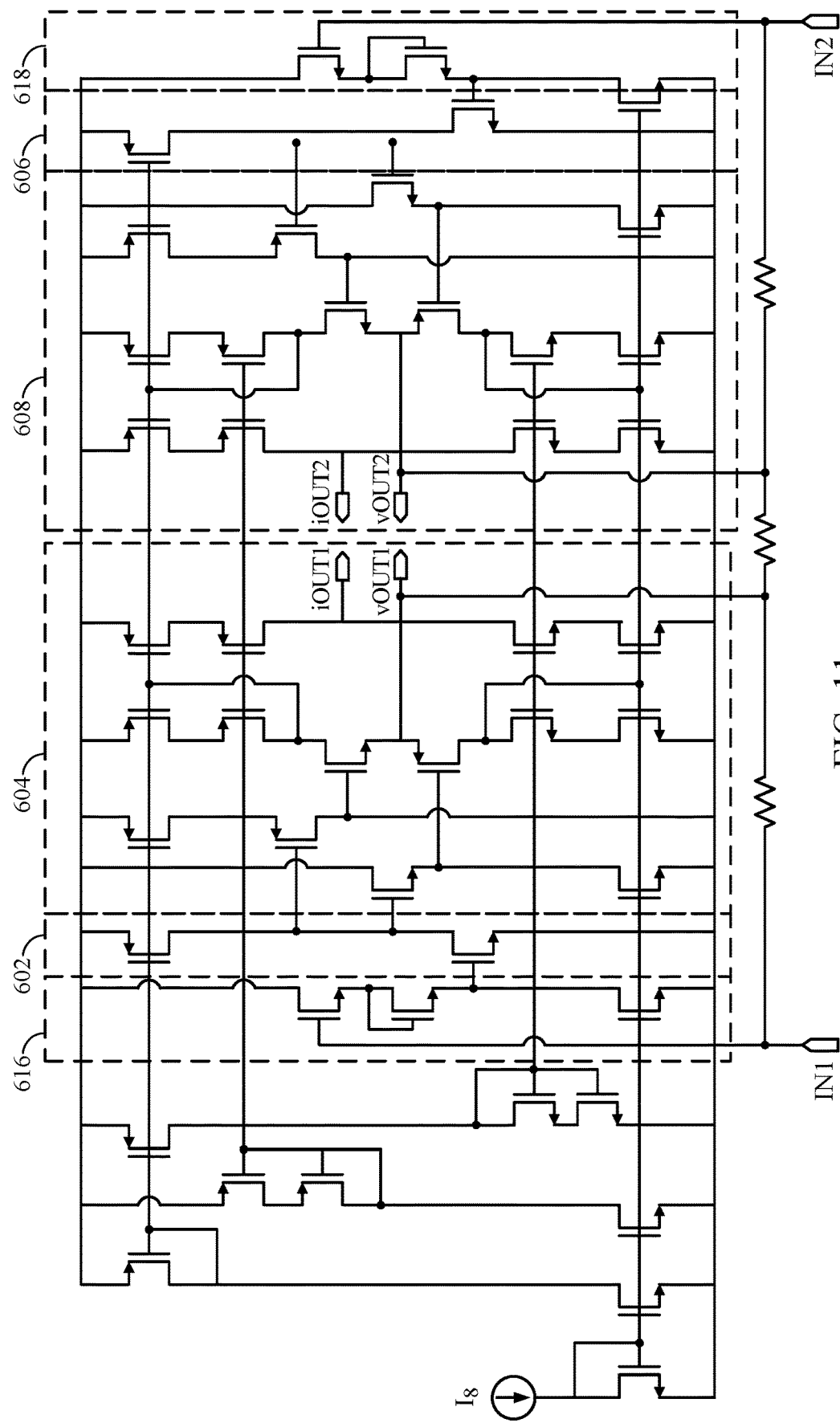
FIG. 11 illustrates an example schematic diagram of the current amplifier of FIG. 6, in accordance with certain aspects of the present disclosure.

FIG. 11 illustrates an example schematic diagram of the current amplifier of FIG. 6, in accordance with certain aspects of the present disclosure. In one implementation, the current amplifier 212 includes level shifting stages 616,618 configured in accordance with FIG. 7, voltage amplification stages 602,606 configured in accordance with FIG. 8, and buffer stages 604,608 configured in accordance with FIG. 9B.

Figure 12:
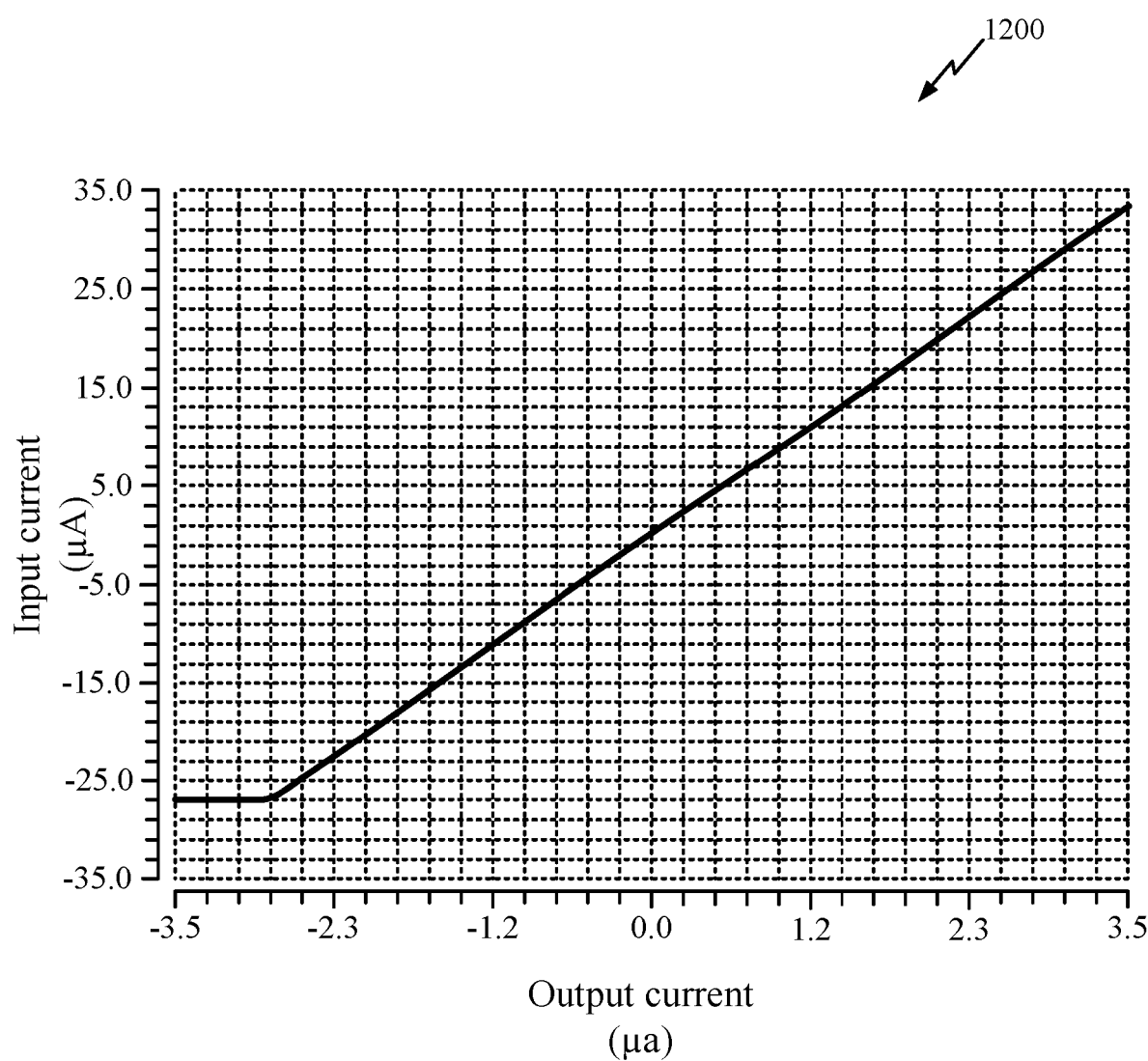
FIG. 12 illustrates an example graph of the direct current (DC) transfer characteristic of the current amplifier of FIG. 6, in accordance with certain aspects of the present disclosure.

FIG. 12 illustrates an example graph 1200 of the direct current (DC) transfer characteristic of the current amplifier of FIG. 6, in accordance with certain aspects of the present disclosure. The x-axis of the graph 1200 represents an amount of input current in microamperes (μA) and the y-axis represents the amplified output current of the current amplifier in μA. As can be seen by the graph, the gain of the output current is approximately ten times (10×) the input current. For example, the current amplifier is outputting approximately 12 μA when the input current is 1.2 μA.

Figures 13, 14:
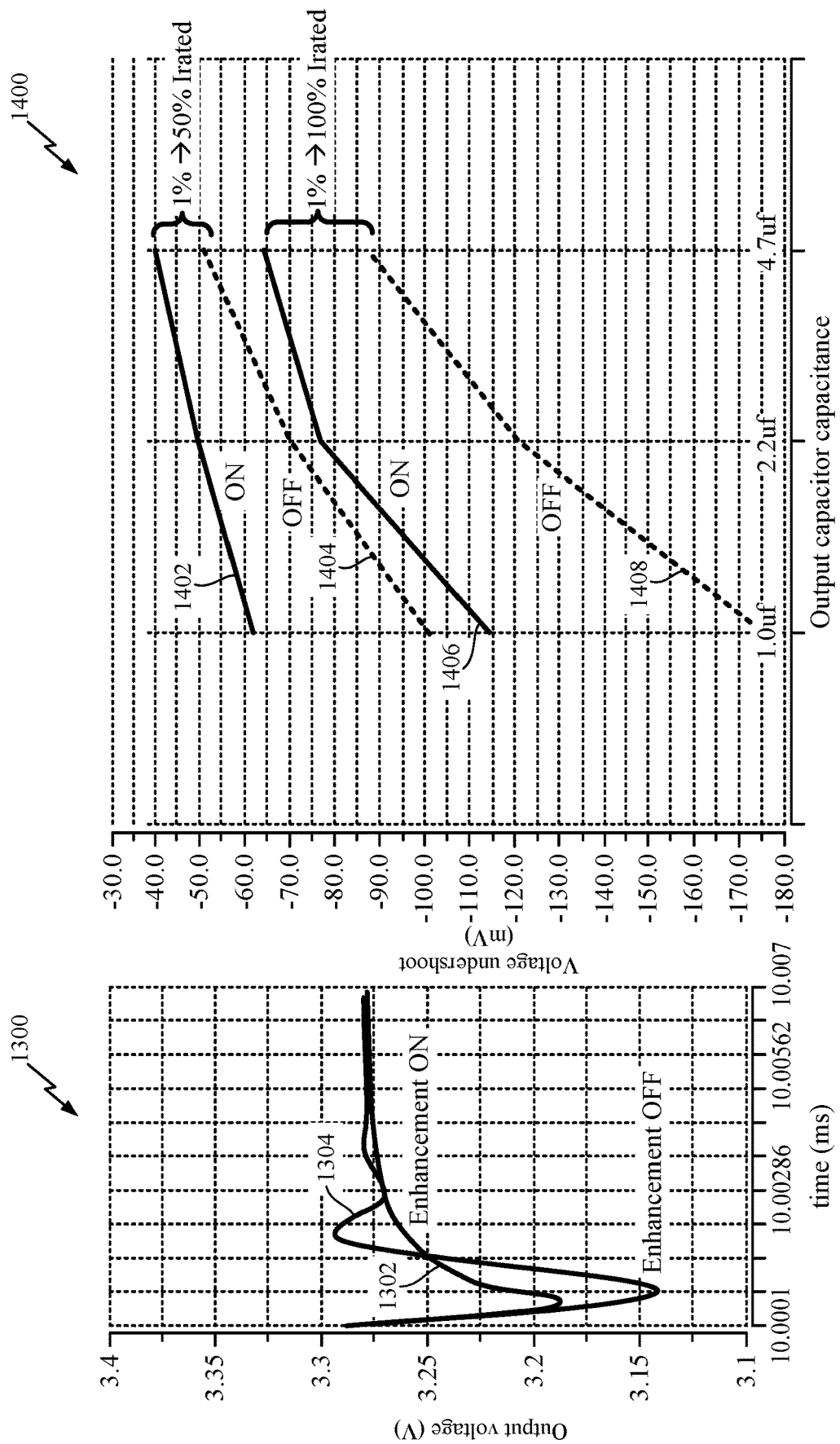
FIG. 13 illustrates an example graph comparing the load transient of the regulator of FIG. 2 with a regulator not using output sense current, in accordance with certain aspects of the present disclosure.
FIG. 14 illustrates an example graph comparing the voltage undershoot of the regulator of FIG. 2 with a regulator not using output sense current, in accordance with certain aspects of the present disclosure.

FIG. 13 illustrates an example graph 1300 comparing the load transient of the regulator of FIG. 2 with a regulator not configured to sense output current, in accordance with certain aspects of the present disclosure. The x-axis represents an amount of time in milliseconds (mS) and the y-axis represents the output voltage in volts (V). As can be seen from the graph 1300, the load transient performance, as indicated by the output voltage level, with the enhancement ON indicated by line 1302 is improved compared to a regulator not using output current sense (enhancement OFF) indicated by line 1304. For example, line 1302 shows a smaller dip in the output voltage level in response to a load attack than line 1304 which shows a larger dip of approximately 0.05 V. Furthermore, the dip of line 1302 ends earlier than the dip of line 1304 thereby demonstrating the improved transient response when using output sense current in accordance with aspects of the present disclosure.

FIG. 14 illustrates an example graph 1400 comparing the voltage undershoot of the regulator of FIG. 2 with a regulator not configured to sense output current, in accordance with certain aspects of the present disclosure. The x-axis presents the capacitance of the output capacitor of the regulator in microfarads (μF) and the y-axis represents an amount of voltage undershoot in millivolts (mV). Line 1402 represents the voltage undershoot performance of a regulator, operating at 50% of its rated current, implementing the output sense current enhancement over a range of output capacitor values while line 1404 represents the voltage undershoot performance of the regulator without the output sense current enhancement. As can be seen from the graph, line 1402 has less voltage undershoot than line 1404 at a particular output capacitor value. In addition, as can be seen by line 1402 at 2.2 μF and line 1404 at 4.7 μF, a regulator with the enhancement can achieve a similar voltage undershoot performance implementing a smaller output capacitor than the non-enhanced regulator. Furthermore, when the regulator is operating at 100% of its rated current, the voltage undershoot performance of a regulator implementing output sense current, as shown by line 1406, may be an improvement using a smaller output capacitor (e.g., 2.2 μF) as compared to a non-enhanced regulator implementing a larger output capacitor (e.g., 4.7 μF) as shown by line 1408. It should be noted that a non-enhanced regulator may be configured with circuitry to sense output current as described herein, although the circuitry may be disabled.

Figure 15:
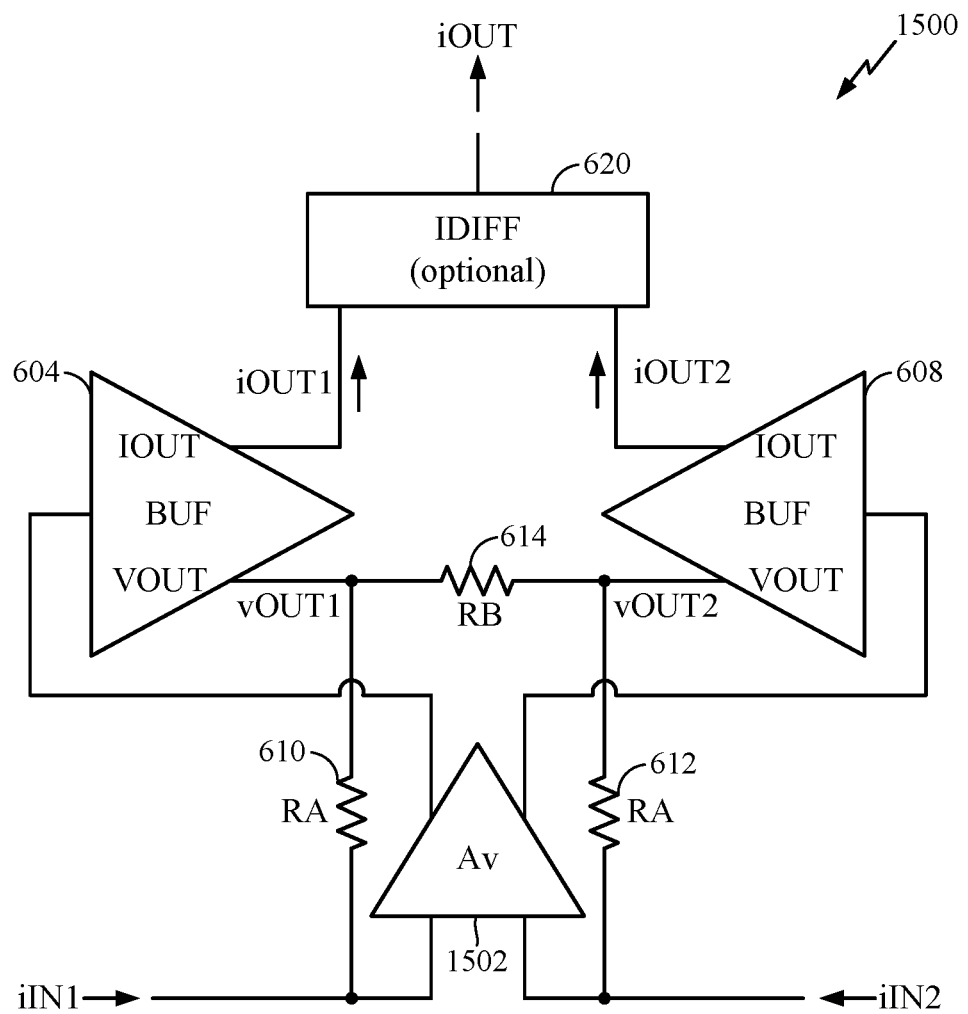
FIG. 15 illustrates an example implementation of the current amplifier using a differential voltage amplifier of the regulator of FIG. 2, in accordance with certain aspects of the present disclosure.

FIG. 15 illustrates an example implementation 1500 of the current amplifier using a differential voltage amplifier of the regulator of FIG. 2, in accordance with certain aspects of the present disclosure. The current amplifier 1500 includes a differential voltage amplifier 1502 having a first input coupled to the first differential current input iIN1 and a second input coupled to the second differential current input iIN2. The first differential input iIN1 may be coupled to a terminal of the sense capacitor and the second differential input iIN2 may be coupled to a reference potential such as ground. The differential voltage amplifier 1502 further includes a first voltage output coupled to the input of a first buffer stage 604 and a second voltage output coupled to the input of a second buffer stage 608. A voltage output vOUT1 of a first buffer stage 604 is coupled to the first differential current input iIN1 and the first input of differential voltage amplifier 1502 via a first resistive element 610 while a voltage output vOUT2 of the second buffer stage 608 is coupled to the second differential current input iIN2 and the second input of differential voltage amplifier 1502 via a second resistive element 612. The voltage outputs of the buffer stages 604,608 are further coupled together via a third resistive element 614. The first and the second buffer stages 604,608 each include a current output iOUT1,iOUT2. The current outputs iOUT1 and iOUT2 may each be coupled to a control loop of the voltage regulator. The current outputs iOUT1 and iOUT2 may be optionally coupled to differential inputs of a current differencer 620 to provide a single-ended output current iOUT to the control loop.

In one implementation, the differential voltage amplifier 1502 is configured with an input impedance and a gain sufficiently high enough to generate a virtual short between the first and second inputs of the differential voltage amplifier 1502. Accordingly, current received from the differential current inputs iIN1 and iIN2 is forced into the voltage outputs of the first and second buffer stages 604,608 as a function of the resistive ratio between the first, second, and third resistive elements 610,612,614 in a similar fashion as described with respect to FIG. 6

Figure 16:
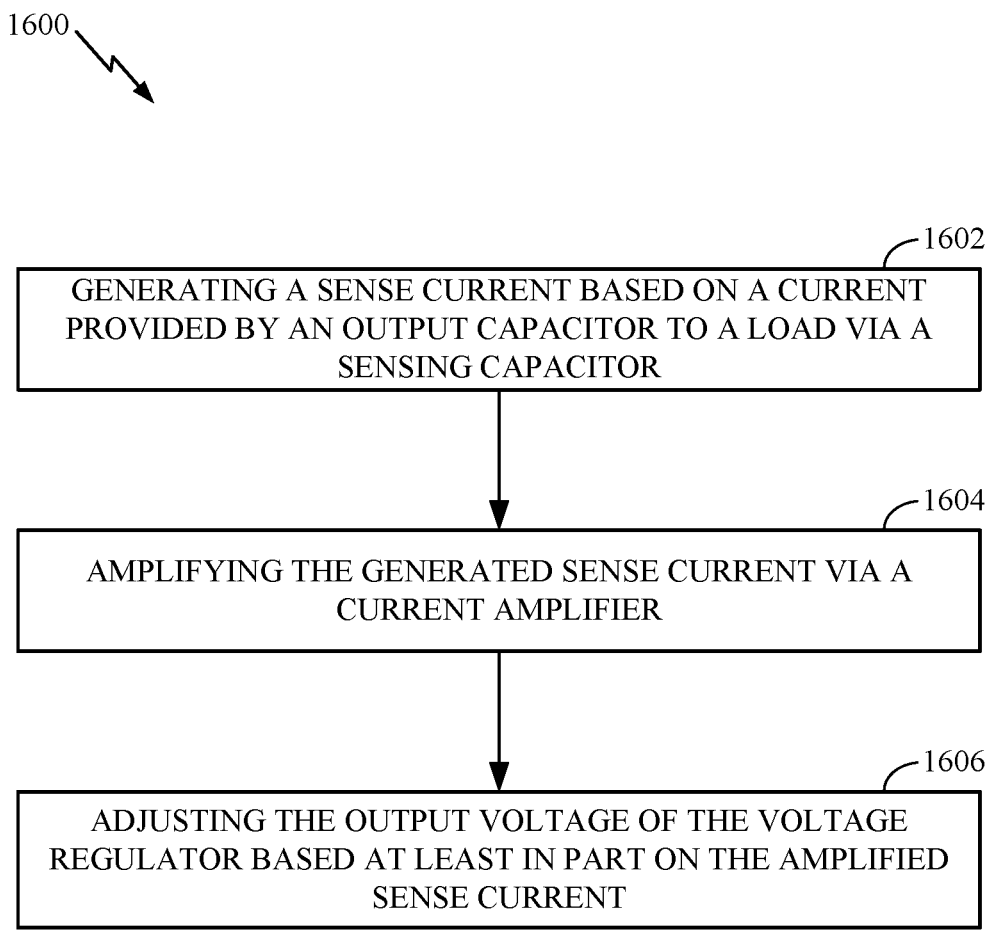
FIG. 16 illustrates an example operation of a voltage regulation method using output sense current, in accordance with certain aspects of the present disclosure.

FIG. 16 illustrates an example operation 1600 of a voltage regulation method using output sense current, in accordance with certain aspects of the present disclosure. The operations may be performed by a circuit, such as FIGS. 3-11.

At block 1602, a sense current is generated based on a current provided by an output capacitor via a sensing capacitor. The current may be generated in response to a current drawn by a load attached to the output of the voltage regulator. For example, as the output capacitor and sensing capacitor may be coupled to an output of a voltage regulator, when the output capacitor discharges an amount of a current due to a load attack, the sensing capacitor also discharges a proportional amount of current. The proportionality of the discharged currents of the output capacitor and the sensing capacitor is based at least on the respective capacitance values of the output and sensing capacitors.

At block 1604, the generated sensed current is amplified via a current amplifier. The gain of the amplification may be based operational requirements of the voltage regulator. For example, the loop bandwidth of the feedback loop of the control stage may be a function of the gain of the current amplifier such that higher gain attributes to a higher loop-bandwidth which impacts phase margin of the regulator. Exceeding the phase margin will cause instability of the control loop of the regulator. Accordingly, the amount of gain of the current amplifier may be limited by an amount of available phase margin of the regulator.

At block 1606, the output voltage of the voltage regulator is adjusted based at least in part on the amplified sense current. In one implementation, the amplified sense current is injected into at least a portion a control stage of the voltage regulator to adjust a transient response of the regulator when experiencing a load attack. For example, the amplified sense current may be injected into a portion of a TIA in the control stage of the voltage regulator. In addition, the amplified sense current may have a bias current component removed that was introduced during a portion of the current amplification, such as via a current differencer, prior to being injected.

While the current amplifier has been described herein mainly in the context of improving the transient response of a regulator, it should be noted that the current amplifier of the present disclosure may be implemented for various other purposes. For example, the current amplifier may be implemented as a capacitor multiplier. When configured as a capacitor multiplier, the current amplifier may be implemented in a loop of a Miller compensated amplifier to increase the equivalent capacitance value of a capacitor. The equivalent capacitance of the capacitor may be a function of the gain of the current amplifier. In one implementation, the equivalent capacitance equals the gain of the current amplifier times the capacitance of the capacitor of the Miller compensated amplifier. Therefore, in such an implementation, a current amplifier with a gain of ten (10×) would present an equivalent capacitance of 10 picofarads (10 pF) for a 1 pF capacitor. Accordingly, Miller compensated implemented with the current amplifier of the present disclosure may achieve area savings by reducing the capacitor size needed to achieve a desired capacitance.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

In certain aspects, means for sensing may include a capacitor such as sense capacitor 210. In certain aspects, means for amplifying may include an amplifier such as the current amplifier 212. In certain aspects means for adjusting may include a control stage such as the error amplifier 302, the buffer 304 and/or transistor 202.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete gate or transistor logic, discrete hardware components, or any combination thereof designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A voltage regulator, comprising:
   a transistor having a first terminal coupled to an input voltage, a second terminal coupled to an output of the voltage regulator, and a gate terminal;
   a control stage comprising an error amplifier and a transimpedance amplifier (TIA), the TIA coupled between an output of the error amplifier and the gate terminal of the transistor while the error amplifier is coupled between the output of the voltage regulator and the TIA;

a sense capacitor having first and second terminals, the first terminal coupled to the output of the voltage regulator; and a current amplifier having an input coupled to the second terminal of the sense capacitor and an output coupled to the TIA of the control stage.

2. The voltage regulator of claim 1, wherein the output of the voltage regulator is further coupled to an output capacitor; and wherein the sense capacitor is configured to supply a current to the current amplifier proportional to a current supplied by the output capacitor to a load.

3. The voltage regulator of claim 2, wherein the current amplifier is configured to amplify the current supplied by the sense capacitor and provide the amplified current to at least a portion of the TIA of the control stage.

4. The voltage regulator of claim 2, wherein the sense capacitor is located on a semiconductor die and the output capacitor is located off the semiconductor die.

5. The voltage regulator of claim 1, wherein the current amplifier comprises:

a voltage amplification stage coupled to the input of the current amplifier; and a buffer stage having an input coupled to an output of the voltage amplification stage and an output coupled to the output of the current amplifier.

6. The voltage regulator of claim 5, wherein the current amplifier further comprises a level shifting stage coupled between the input of the current amplifier and an input of the voltage amplification stage.

7. The voltage regulator of claim 5, wherein the voltage amplification stage comprises:

a first voltage amplifier having an input coupled to the second terminal of the sense capacitor; and a second voltage amplifier having an input coupled to a reference potential.

8. The voltage regulator of claim 7, wherein the buffer stage comprises:

a first buffer having an input coupled to an output of the first voltage amplifier and a current output coupled to the output of the current amplifier; and a second buffer having an input coupled to an output of the second voltage amplifier and a current output coupled to the output of the current amplifier.

9. The voltage regulator of claim 8, further comprising:

a first resistive element coupled between the input of the first voltage amplifier and a voltage output of the first buffer;

a second resistive element coupled between the input of the second voltage amplifier and a voltage output of the second buffer; and a third resistive element coupled between the voltage output of the first buffer and the voltage output of the second buffer.

10. The voltage regulator of claim 9, wherein the first and second buffers each comprise:

a transistor having a gate coupled to the input of the buffer, a drain coupled to the current output of the current buffer, and a source coupled to the voltage output of the buffer; and a current source coupled to the drain of the transistor.

11. The voltage regulator of claim 8, further comprising a current differencer comprising:

a first input coupled to the current output of the first buffer;

a second input coupled to the current output of the second buffer; and an output coupled to the output of the current amplifier.

12. The voltage regulator of claim 11, wherein the current differencer is configured to remove a bias current component from currents supplied from the outputs of the first and second buffers.

13. The voltage regulator of claim 7, wherein the first and second voltage amplifiers each comprise:

a transistor having a gate coupled to the input of the voltage amplifier, a source coupled to ground, and a drain coupled to an output of the voltage amplifier; and a current source coupled to the drain of the transistor.

14. A voltage regulator comprising:

a control loop, including an error amplifier and a transimpedance amplifier (TIA) configured to adjust an output voltage provided the voltage regulator;

a sense capacitor coupled to an output of the voltage regulator and the error amplifier of the control loop, the sense capacitor configured to provide a current proportional to a current provided by an output capacitor to a load;

and a current amplifier configured to amplify the sense capacitor current and provide the amplified sense current to the TIA of the control loop.

15. The voltage regulator of claim 14, wherein the control loop is configured to improve a transient response of the control loop in response to a load attack based on the amplified sense current.

16. The voltage regulator of claim 14, wherein the current amplifier comprises:

a differential voltage amplifier having a first input coupled to a terminal of the sense capacitor and a second input coupled to a reference potential; and a buffer stage having an input coupled to a first and a second output of the differential voltage amplifier and an output coupled to the TIA of the control loop.

17. The voltage regulator of claim 16, wherein the buffer stage comprises:

a first buffer having an input coupled to the first output of the differential voltage amplifier and a current output coupled to the control loop; and a second buffer having an input coupled to the second output of the differential voltage amplifier and a current output coupled to the control loop.

18. The voltage regulator of claim 17, wherein the current amplifier further comprises:

a first resistive element coupled between the first input of the differential voltage amplifier and a voltage output of the first buffer;

a second resistive element coupled between the second input of the differential voltage amplifier and a voltage output of the second buffer; and a third resistive element coupled between the voltage outputs of the first and second buffer.

19. The voltage regulator of claim 18, wherein a gain of the current amplifier is based on a ratio between an amount of resistance of the first and second resistive elements and an amount of resistance of the third resistive element.

20. The voltage regulator of claim 17, further comprising a current differencer configured to remove a bias current component provided by the current outputs of the first and second buffers to the control loop.

* * * * *